US006699375B1

United States Patent
Crocker

(10) Patent No.: US 6,699,375 B1
(45) Date of Patent: Mar. 2, 2004

(54) METHOD OF EXTENDING PROCESS KIT CONSUMABLE RECYCLING LIFE

(75) Inventor: Steven C. Crocker, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/609,015

(22) Filed: Jun. 29, 2000

(51) Int. Cl.[7] .......................... C23C 14/34; C23C 16/00
(52) U.S. Cl. ................. 204/298.15; 118/715; 118/720; 118/721; 118/727; 118/729
(58) Field of Search ................ 204/298.11, 298.15; 118/715, 720, 721, 727, 729

(56) References Cited

U.S. PATENT DOCUMENTS

| | | | |
|---|---|---|---|
| 3,669,871 A | 6/1972 | Elmgren et al. ............ 204/298 |
| 4,476,000 A | 10/1984 | Nagao et al. .......... 204/192 M |
| 5,039,388 A | 8/1991 | Miyashita et al. ..... 204/192.32 |
| 5,135,629 A | 8/1992 | Sawada et al. ........ 204/192.12 |
| 5,202,008 A | * 4/1993 | Talieh et al. ............ 204/192.32 |
| 5,380,414 A | * 1/1995 | Tepman .................. 204/192.3 |
| 5,431,799 A | * 7/1995 | Mosely et al. .......... 204/298.06 |
| 5,482,612 A | 1/1996 | Armstrong et al. .... 204/298.11 |
| 5,584,973 A | * 12/1996 | Wada et al. ............ 204/192.12 |
| 5,624,536 A | * 4/1997 | Wada et al. ............ 204/298.11 |
| 5,811,195 A | 9/1998 | Bercaw et al. ............... 428/472 |
| 5,961,793 A | 10/1999 | Ngan ................... 204/192.12 |
| 6,120,640 A | 9/2000 | Shih et al. ................... 156/345 |
| 6,242,111 B1 | 6/2001 | Telford et al. ............... 428/629 |
| 6,277,253 B1 | 8/2001 | Narasimhan et al. .. 204/298.06 |
| 6,394,023 B1 | 5/2002 | Crocker ....................... 116/208 |
| 6,428,663 B1 | 8/2002 | Mostovoy et al. ..... 204/298.12 |

FOREIGN PATENT DOCUMENTS

| | | | |
|---|---|---|---|
| EP | 0590904 | 6/1994 | ........... C23C/14/34 |
| JP | 10-110267 | * 4/1998 | |

OTHER PUBLICATIONS

ASM Handbook, vol. 5, Surface Engineering, pp. 497–509 and 835–849 (1994).

* cited by examiner

Primary Examiner—Rodney G. McDonald
(74) Attorney, Agent, or Firm—Konrad, Raynes, Victor & Mann

(57) ABSTRACT

One embodiment relates to an apparatus for sputtering material onto a workpiece, the apparatus including a vacuum chamber and a target disposed in the vacuum chamber, the target comprising a material to be deposited onto said workpiece. The apparatus also includes a holder for the workpiece and at least one recyclable process kit component positioned to accumulate material sputtered from the target. The process kit component includes a base metal layer including titanium and an outer layer of titanium nitride. The titanium nitride layer acts as an etch stop during recycling of the process kit component. The process kit component may include a part selected from the group of a shield, pedestal, shutter, coil, collimator, deposition ring, cover ring, and clamp ring.

20 Claims, 4 Drawing Sheets

METHOD OF EXTENDING PROCESS KIT CONSUMABLE RECYCLING LIFE

FIELD OF THE INVENTION

The present invention relates to deposition processes and components used in semiconductor device fabrication chambers, including recyclable process kit components.

BACKGROUND

The formation of semiconductor devices often includes depositing various layers onto a substrate using methods such as physical vapor deposition (sputtering) and chemical vapor deposition. Such methods tend to form a layer of deposition material not only on the substrate, but also on other exposed surfaces in the processing chamber. Particles of the material deposited on the other exposed surfaces in the processing chamber may flake off during various processing cycles such as heating, cooling, pressure changes, etc., and contaminate the device being formed. In order to reduce contamination, chamber surfaces which are exposed to deposition material may be periodically cleaned or replaced.

One technique for cleaning and replacement includes the use of recyclable process kits including chamber components that can be removed from the chamber, cleaned of deposition material, and then reused in the chamber. By using recyclable components, the chamber down time is minimized because many of the components can be quickly replaced with a second set of clean components and the first set of components can then be cleaned outside of the chamber. While the first set of components is being cleaned, the chamber is available for processing. Process kits may include one or more components, depending on factors such as the type of chamber, the wafer support pedestal, the type of deposition being carried out, and the process being carried out in the chamber. Certain known deposition chambers, for example, may utilize a variety of pedestals, including those that operate in conjunction with a clamp ring that holds a wafer to the pedestal, and those that operate without a clamp ring and leave the entire surface of the wafer available for deposition. Some pedestals also utilize electrostatic forces to attract the wafer to the pedestal surface. Chamber components which may be removed and recycled include, but are not limited to, shields, coils, pedestals, shutters, collimators, deposition rings, cover rings, clamp rings, and showerheads as known in the art.

The recyclable chamber components may be cleaned using a variety of chemical and physical methods known in the art. One chemical method includes submersing the component in a chemical solution that chemically etches the deposited material from the component. One such physical method is bead blasting, which physically removes deposited material from the component. Due to the desirability of removing all or nearly all of the deposited material on the process kit component, a quantity of the base material the component is formed from (for example, titanium) is often also removed during the cleaning operation, thus shortening the life of the component. After a number of cycles of deposition followed by cleaning, a sufficient quantity of base material may be removed such that the component no longer meets the acceptable tolerances to properly perform its intended function. In addition, base metal removal may result in the surface of the component having an undesirable level of surface roughness, which can lead to problems such as deposition material flaking off the component while in the processing chamber and contaminating the workpiece.

Metrology methods may be used to determine whether a component is out of tolerance. However, such methods are time consuming. Methods for determining the surface roughness are also time consuming and add costs to the overall process. Because the amount of material removed during a cleaning process can be difficult to determine, a recommended number of cleanings is sometimes specified by the manufacturer for recyclable components, in order to ensure that the components will remain in tolerance. When the recommended number of cleanings is reached, the component is disposed of. Depending on the actual amount of base material removed during the cleaning cycles, the component may still be useable despite reaching the recommended number of cleanings. As a result, employing a recommended number of cleanings approach may result in recyclable components being discarded prematurely.

SUMMARY

Certain embodiments of the present invention relate to a device for use in a deposition chamber. The device comprises a recyclable process kit component including a base metal and a protective layer formed on the base metal. The protective layer comprises a material having a different composition than the base metal. In one aspect of certain embodiments, the base metal is titanium. In another aspect of certain embodiments, the protective layer is a nitride layer having a thickness of no greater than $10/1000$ inch.

Embodiments also include an apparatus including a base metal shaped in the form of a recyclable process kit component and an etch stop layer on the base metal. The etch stop layer comprises a material having different etching properties than the base metal.

Other embodiments relate to an apparatus for sputtering material onto a workpiece, the apparatus including a vacuum chamber and a target disposed in the vacuum chamber, the target comprising a material to be deposited onto the workpiece. The apparatus also includes a holder (commonly referred to as a pedestal or chuck) for the workpiece and at least one recyclable process kit component positioned to accumulate material sputtered from the target. The process kit component includes a base metal layer including titanium and an outer layer including nitrogen. In one aspect of certain embodiments, the process kit component is selected from the group consisting of a shield, pedestal, shutter, coil, collimator, deposition ring, cover ring, and clamp ring.

Other embodiments relate to a method including performing a plurality of deposition operations in a process chamber so that material is deposited on a recyclable component. The recyclable component includes a base metal and an etch resistant layer on the base metal. The method also includes removing the recyclable component from the process chamber and etching the deposited material from the recyclable component. The etching is stopped when the etch resistant layer is reached.

Still other embodiments relate to a method for forming a process kit component outside of a semiconductor processing chamber, including forming a body into the shape of a process kit component and forming a nitride layer to a depth in the body. In one aspect of certain embodiments, forming a body into the shape of a process kit component includes performing a first machining operation on a metal body comprising titanium to form a shape close to that of a desired process kit component, performing a first heat treating operation on the body to relieve stresses generated in the body during the first machining, and performing a second machining operation on the body to form the body into a shape closer to that of the desired process kit component. Certain embodiments may also include performing a second heat treating operation on the body after the second machining operation.

BRIEF DESCRIPTION OF THE DRAWINGS

Embodiments of the invention are described with reference to the accompanying drawings which, for illustrative purposes, are schematic and not drawn to scale.

DETAILED DESCRIPTION

Figure 1:
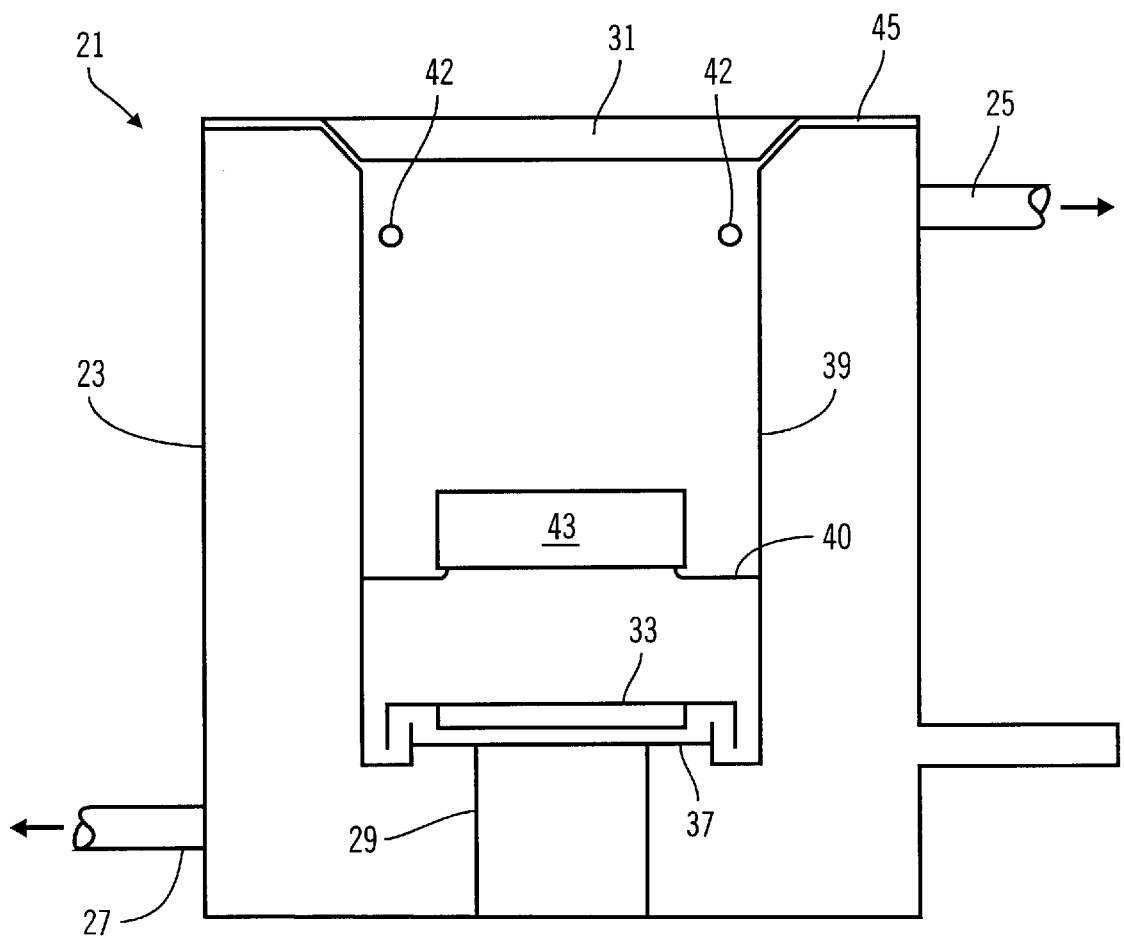
FIG. 1 is a schematic, partial cross-sectional view of a processing chamber configured for physical vapor deposition in accordance with an embodiment of the present invention.

Certain embodiments of the present invention relate to process kit components for use in deposition chambers that are formed from a base metal and include a protective layer that protects the base metal during cleaning operations.

One preferred embodiment includes process kit components formed from titanium (or titanium having a small amount of alloying materials therein) as the base metal and having a nitride layer at the surface of the titanium. The nitride layer creates a surface that resists etching during cleaning operations performed to remove material deposited on the component during processing operations such as sputtering. It is preferred that the nitride surface layer on the process kit components be formed by a batch process. A number of processes for nitriding titanium surfaces are known. One method includes heating titanium components in a nitrogen or ammonia atmosphere to diffuse nitrogen into the titanium structure. The pressure and temperature may be chosen to form layers of varying thickness and physical properties. Other methods for nitriding titanium include salt bath treatment, plasma processing, and hot isostatic pressing.

In certain embodiments, a titanium nitride layer is formed on the surface of one or more titanium process kit components and these components are mounted in a sputtering chamber. When using a chamber having replaceable process kit components, the equipment manufacturer typically provides guidelines that set forth the recommended number of processing steps in a chamber before process kit components should be cleaned and/or replaced. For example, a chamber such as that illustrated in FIG. 1, when performing aluminum deposition, may deposit up to about 6000 $\mu$m of aluminum before process kit cleaning is recommended.

After the recommended number of processing cycles has been performed, the process kit components are removed from the processing chamber. Clean process kit components may then be inserted into the chamber, so that there is little chamber downtime. The deposited material is cleaned from the process kit components so that they can be reused. One preferred method to clean the component is to place the component into one or more chemical baths to etch the deposited material from the component. Alternatively, the components may be exposed to a gaseous etchant. The nitride layer formed on process kit components according to certain preferred embodiments inhibits etching of the base metal of the component. Without the nitride layer, the base metal of the component (for example, titanium) may be undesirably etched when the component is etched to remove the deposited layer. This may occur because the etchant used to remove a deposited material such as aluminum may also etch a base metal of the process kit component. As a result, after a number of cleanings, the critical dimensions of the part such as, for example, its thickness and/or surface roughness, may fall outside of the acceptable level. Materials which may be used for etching aluminum include solutions having one or more acids, for example, $H_3PO_4$, $HNO_3$, and HF. Such acids tend to etch metals including aluminum and titanium at a significantly higher rate than they etch a nitride such as titanium nitride. Accordingly, the nitride layer formed on the base metal component will inhibit undue etching of the base metal.

Figure 2:
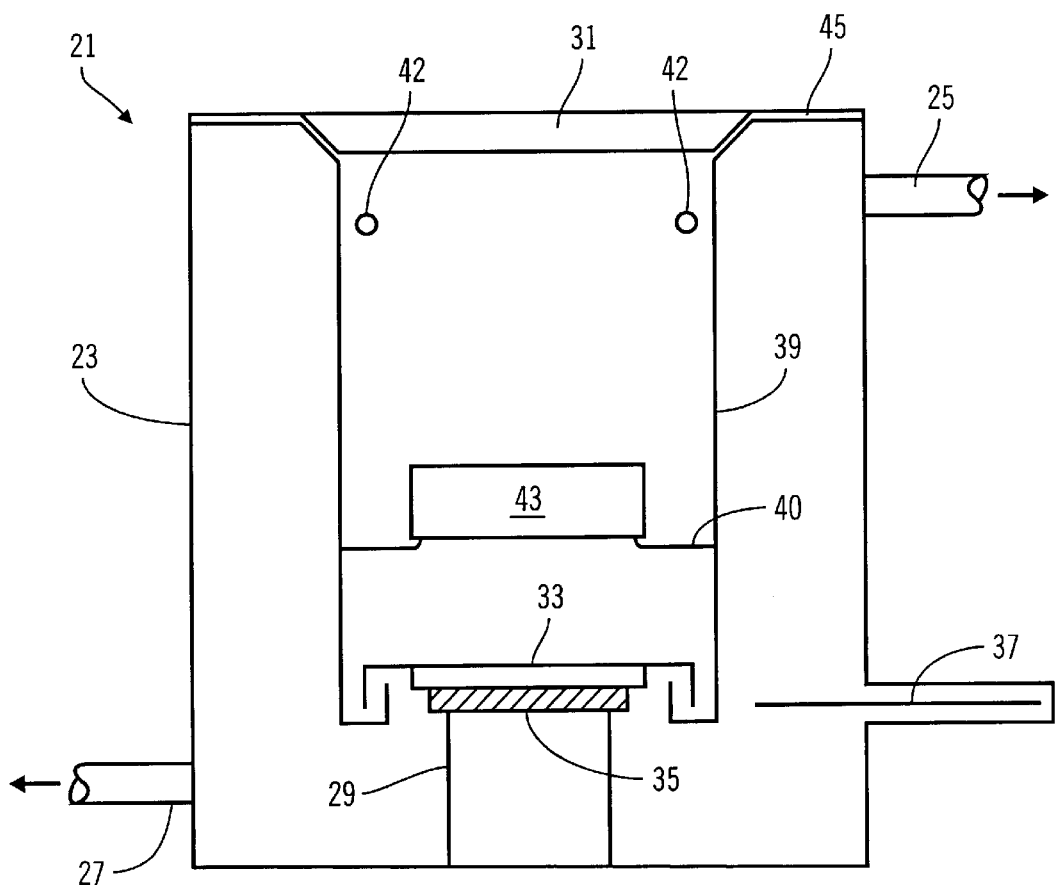
FIG. 2 is a schematic, partial cross-sectional view of a processing chamber configured for physical vapor deposition in accordance with an embodiment of the present invention.

FIGS. 1 and 2 illustrate sectional views of an exemplary sputtering chamber 21 according to an embodiment of the present invention. The chamber is based on the 200 mm DURASOURCE® chamber sold by Applied Materials, Inc. The sputtering chamber 21 includes a vacuum chamber enclosure wall 23 having at least one gas inlet 25 and an exhaust outlet 27 connected to an exhaust pump (not shown). A pedestal or substrate support 29 is disposed near the bottom of the sputtering chamber and a sputtering target 31 generally facing the substrate support is mounted at the top end of the chamber. A clamp ring 33 is positioned to be coupled to the substrate support 29 so as to apply uniform pressure to a substrate 35 to hold the substrate 35 to the substrate support 29. A shutter assembly (not shown) is rotatably mounted within the sputtering chamber 21 for selectively positioning a shutter disk 37 between the target 31 and a portion of the sputtering chamber 21 (i.e., placing the shutter disk 37 in a closed position). Thus, when positioned in the closed position, deposition material is inhibited from depositing on surfaces beneath the shutter disk 37. One purpose of the shutter disk is to protect the pedestal during pasting operations carried out to coat internal surfaces of the chamber with deposition material prior to introducing the substrate to the chamber. By coating internal surfaces of the chamber with the deposition material, any flakes of material that are dislodged from the interior surfaces while depositing a layer of material on the substrate will have the same composition as the material sputtered from the target, thus inhibiting contamination of the substrate.

In certain embodiments, the shutter disk 37 is positioned to be between the clamp ring 33 and the substrate support 29 when the shutter disk 37 is in the closed position (as shown in FIG. 1), in order to protect the substrate support from sputtered material. One or more shields 39 may be positioned, for example, near the edges of the target 31 and may extend to the substrate support 29 or to a position somewhere between the target 31 and substrate support 29 so as to limit the travel of deposition material and in certain embodiments at least partially define a plasma generation region. The shield 39 may be formed from one piece or multiple pieces. A collimator 43 (e.g., a tube or a screening plate) which blocks sputtered material that travels toward the substrate 35 along an undesirable trajectory may optionally be mounted between the target 31 and the substrate support 29 (via a lip 40) which may extend from the enclosure wall 23 or from the shield 39. In addition, a coil 42 may also optionally be positioned in or around the chamber in order to provide additional energy to ionize an amount of sputtered material for improving step coverage of the deposited layer on the workpiece.

The target 31 is electrically isolated from enclosure wall 23 (e.g., via an insulating ring 45). Enclosure wall 23 and shield 39 are preferably grounded so that a negative voltage may be maintained on the target 31 with respect to grounded enclosure wall 23 and shield 39. FIG. 2 shows the sputtering chamber 21 of FIG. 1 with the shutter disk 37 in the open position, so that sputtered material can be deposited on a wafer 35. As illustrated, the clamp ring 33 presses the substrate 35 against the substrate support 29. The shutter disk 37, the shield 39, the collimator 43 and the clamp ring 33 illustrated in FIGS. 1 and 2 are examples of removable process kit parts that may be formed with a nitride surface layer according to certain preferred embodiments.

Figure 3:
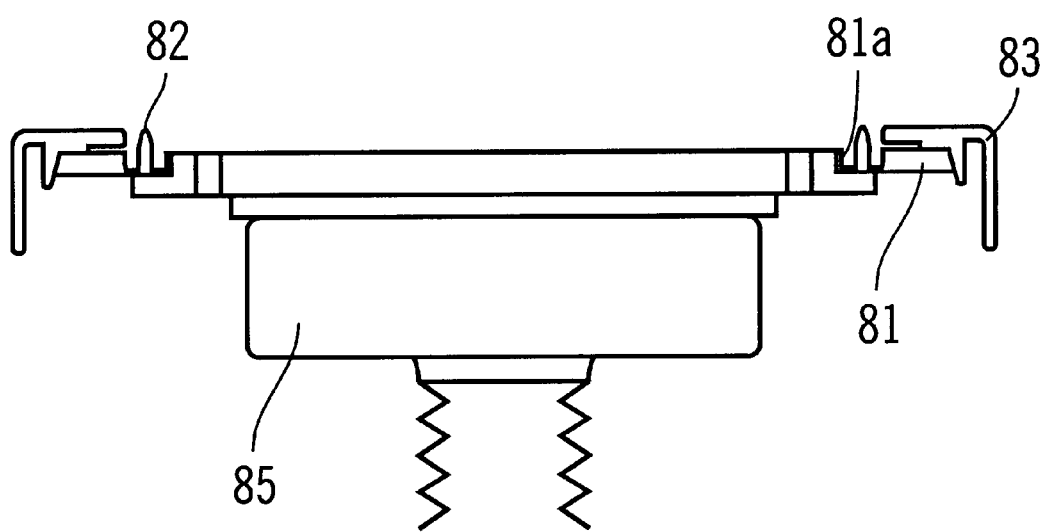
FIG. 3 is a side cross sectional view illustrating components including a deposition ring and a cover ring in accordance with an embodiment of the present invention.

FIG. 3 shows additional process kit rings which may be used in the chamber of FIGS. 1 and 2 as an alternative to the clamp ring 33. Specifically, FIG. 3 shows a schematic side view of a deposition ring 81 (which may include wafer restriction pins 82 that prevent a wafer from moving out of position) and a cover ring 83. The deposition ring 81 is designed primarily to inhibit deposition on the side of a substrate support 85, as the substrate support 85 is often not easily removed from the chamber for cleaning. One feature that may be affected by deposition material is the height of a lip portion 81a of the deposition ring 81, which extends along the edge of the substrate support 85. The cover ring 83 is designed to allow gas passage while shielding chamber components from deposition. The deposition ring 81 and the cover ring 83 are often used in conjunction with a substrate support known as an electrostatic chuck, which contains positive and negative electrodes that serve to induce polarity in the wafer to attract it to the chuck.

Figure 4:
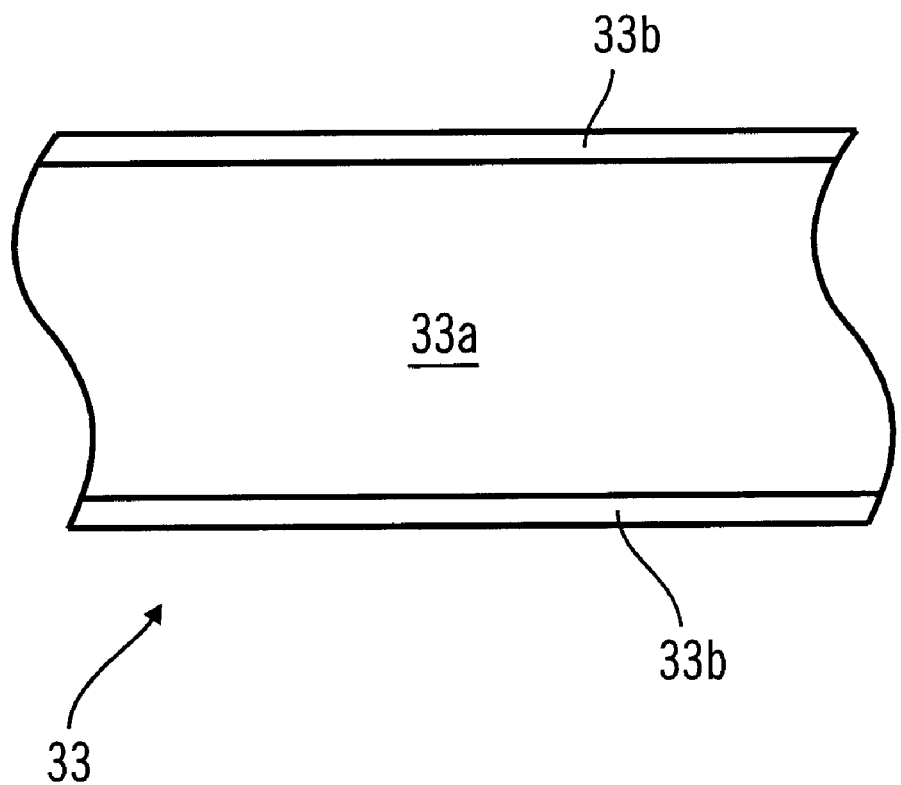
FIG. 4 is a cross-sectional view of a portion of a component illustrating a base metal layer and a protective layer in accordance with an embodiment of the present invention.

Preferred embodiments include titanium process kit components including a nitride surface layer. The surface layer may be TiN or another titanium nitrogen phase, depending on the nitriding conditions. FIG. 4 illustrates a portion of the clamp ring 33 of FIGS. 1–2, including the base metal layer 33a and the outer layer 33b. Other process kit components, for example, the shutter disk 37, shield 39, shield 42, and collimator 43 of FIGS. 1–2; and the deposition ring 81 and cover ring 83 of FIG. 3, may have a similar multilayer structure as the claim ring 33. The surface layer is preferably formed to a thickness that will resist the etchant for numerous cleaning cycles and act as an etch stop. Thus, a variety of thicknesses, including both thin and thick films, are possible. Factors including the durability and the stresses introduced into the component may influence the desired thickness of the outer surface layer. One preferred thickness for the surface layer is in the range of about $1/1000$ inch to about $10/1000$ inch, more preferably about $1/1000$ inch to about $5/1000$ inch. In general, the deeper the surface layer, the more durable the etch stop. However, as the surface layer thickness increases, the surface layer may impart a large residual stress in the component, which may cause stress induced distortion of the component and/or increase the risk of component failure. In certain embodiments, the protective surface layer is formed on the entire surface of the component. In other embodiments, however, the surface layer may only be formed on those surfaces to be exposed to deposition material in the processing chamber and to the etchant during the cleaning step.

To reduce the risk of stress induced component distortion or failure, one preferred method for forming process kit components includes: (a) a machining step to shape the component close to final dimension, (b) a heat treatment step to relieve the stresses caused by the first machining step, (c) an additional, more final machining step, and (d) nitriding the component. If desired, an additional heat treatment step may be carried out after step (c) and prior to step (d). Such a process is designed to minimize the stresses on the process kit component to inhibit stress induced distortion.

By forming recyclable process kit components with a protective surface layer such as in embodiments described above, the components have extremely long lifetimes because the components remain within proper tolerances after numerous cleanings. While certain prior art process kit components fabricated from a base metal only may have a recommended number of cleanings that is about 10 times, embodiments of the present invention may be able to remain in tolerance after hundreds, thousands or even a greater number of cleaning operations.

It will, of course, be understood that modifications of the present invention, in its various aspects, will be apparent to those skilled in the art, some being apparent only after study, others being matters of routine mechanical, chemical and electronic design. The term metal as used herein is meant to include metallic materials such as pure metals, alloys of metals, and alloys of metals and other elements. Modifications to the deposition and etching techniques described above may be made as known in the art. In addition, other chamber configurations which may be adapted to perform other processes (chemical vapor deposition, etch, photolithography, etc.) and which may require process kit parts other than those described above, may benefit from process kit parts configured in accordance with embodiments of the present invention. Any chamber which performs a process that requires periodic part cleaning may benefit from the inventive parts described herein.

In addition, process kit components may be formed with surface layers other than a nitride layer. For example, embodiments may also include an anodized layer, oxide layer or other material layer that will protect the base metal from etching during the cleaning process. An example of another process kit component base material on which a protective layer may be formed is stainless steel.

Other embodiments are also possible, their specific designs depending upon the particular application. As such, the scope of the invention should not be limited by the particular embodiments herein described but should be defined by the claims.

What is claimed:

1. A recyclable apparatus for use in a deposition chamber, comprising: a base material shaped in the form of a component used in a deposition chamber; and a diffusion zone comprising a portion of said base material and a diffusion material that is diffused a distance into said base material.

2. An apparatus as in claim 1, wherein said diffusion material comprises nitrogen.

3. An apparatus as in claim 2, wherein said base material comprises titanium.

4. An apparatus as in claim 3, wherein said diffusion zone comprises titanium nitride having a thickness of no greater than $10/1000$ inch.

5. An apparatus as in claim 3, wherein said diffusion zone comprises titanium nitride having a thickness of no greater than $5/1000$ inch.

6. An apparatus as in claim 1, further comprising a layer of sputtered material on said diffusion zone.

7. An apparatus as in claim 6, wherein said diffusion zone has a lower etching rate than said layer of sputtered material when exposed to an etchant.

8. An apparatus as in claim 7, wherein said etchant is selected from the group consisting of $H_3PO_4$, $HNO_3$, and HF.

9. An apparatus as in claim 1, wherein said base material comprises titanium and the diffusion material consists of nitrogen.

10. An apparatus as in claim 1, wherein said component includes at least one component selected from the group consisting of a shield, pedestal, shutter, coil, collimator, deposition ring, cover ring, and clamp ring.

11. A apparatus for sputtering material onto a workpiece, comprising:

a vacuum chamber;

a target disposed in said vacuum chamber, said target comprising a material to be deposited onto said workpiece;

a holder for said workpiece; and at least one recyclable process kit component positioned to accumulate material sputtered from said target, said component comprising a base metal and a diffusion zone including a portion of said base metal and a diffusion material that is diffused a distance into said base metal;

wherein the base metal comprises titanium and the diffusion material comprises nitrogen.

12. An apparatus as in claim 11, wherein said at least one recyclable process kit component includes at least one component selected from the group consisting of a shield, pedestal, shutter, coil, collimator, deposition ring, cover ring, and clamp ring.

13. An apparatus as in claim 12, wherein said outer layer comprises titanium nitride having a thickness of no greater than $10/1000$ inch.

14. An apparatus as in claim 11, further comprising a plasma generation area between said target and said holder; and a coil adapted to radiate energy into said plasma generation area.

15. An apparatus as in claim 11, further comprising a layer of sputtered material on said recyclable process kit component, wherein said layer of sputtered material has an etching rate that is greater than that of said diffusion zone when exposed to an etchant.

16. An apparatus as in claim 15, wherein said etchant is selected from the group consisting of $H_3PO_4$, $HNO_3$, and HF.

17. An apparatus for use in a deposition chamber, comprising a reusable process kit component comprising a base metal and an etch stop layer;

said etch stop layer comprising a diffusion zone including a diffusion material that is diffused a distance into said base metal.

18. An apparatus as in claim 15, wherein the diffusion material consists of nitrogen.

19. An apparatus as in claim 17, wherein said at least one reusable process kit component includes at least one component selected from the group consisting of a shield, pedestal, shutter, collimator, deposition ring, cover ring, and clamp ring.

20. An apparatus as in claim 19, wherein said base metal comprises titanium and said diffusion material consists of nitrogen.

* * * * *